(12) United States Patent
West et al.

(10) Patent No.: US 8,125,054 B2
(45) Date of Patent: Feb. 28, 2012

(54) SEMICONDUCTOR DEVICE HAVING ENHANCED SCRIBE AND METHOD FOR FABRICATION

(75) Inventors: Jeffrey Alan West, Dallas, TX (US); Craig Beddingfield, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 12/565,748

(22) Filed: Sep. 23, 2009

(65) Prior Publication Data

US 2010/0078769 A1    Apr. 1, 2010

Related U.S. Application Data

(60) Provisional application No. 61/099,357, filed on Sep. 23, 2008.

(51) Int. Cl.
*H01L 23/544* (2006.01)
*H01L 21/00* (2006.01)

(52) U.S. Cl. ......... 257/620; 257/E22.011; 257/E21.214; 438/106

(58) Field of Classification Search .................. 257/620, 257/E23.179, E21.214, 774, E23.011; 438/113, 438/462, 689, 106
See application file for complete search history.

(56) References Cited

U.S. PATENT DOCUMENTS

| 5,414,297 | A | 5/1995 | Morita et al. |
| 6,365,958 | B1 | 4/2002 | Ibnabdeljalil et al. |
| 6,521,975 | B1 | 2/2003 | West et al. |
| 6,841,455 | B2 | 1/2005 | West et al. |
| 7,888,776 | B2 * | 2/2011 | Ogawa et al. ............. 257/620 |
| 2006/0012012 | A1 * | 1/2006 | Wang et al. .............. 257/620 |
| 2007/0102792 | A1 * | 5/2007 | Wu ......................... 257/620 |
| 2008/0290340 | A1 |11/2008 | West |

OTHER PUBLICATIONS

R. Novak and T. Ranta, "Antenna Approach Aids Cellular Handsets," Microwaves & RF Magazine, Nov. 2008.

* cited by examiner

*Primary Examiner* — Thomas L Dickey
*Assistant Examiner* — Nikolay Yushin
(74) *Attorney, Agent, or Firm* — Jacqueline J. Garner; Wade J. Brady, III; Frederick J. Telecky, Jr.

(57) ABSTRACT

In a semiconductor device for use in a wafer level chip scale package (WLCSP) and a method for fabrication, an inner scribe seal is formed around a functional circuit area that does not extend all the way into the corners of the rectangular die, and an outer scribe seal follows the perimeter of the die and into the corners, with the outer scribe seal having a continuous barrier wall towards the die edges so that moisture penetration in dielectric layers of the die is minimized, and cracks and delamination are stopped near the die edges. Limiting the extent of the insulating layer or layers in the WLCSP to cover the functional circuit area also reduces the stresses caused by these layers near the die corners.

20 Claims, 4 Drawing Sheets

SEMICONDUCTOR DEVICE HAVING ENHANCED SCRIBE AND METHOD FOR FABRICATION

CROSS-REFERENCE TO RELATED APPLICATIONS

This application claims the benefit of U.S. Provisional Application No. 61/099,357, filed Sep. 23, 2008 by Jeffrey Alan West, the entire contents of which are hereby incorporated by reference.

BACKGROUND OF THE INVENTION

1. Field of the Invention

The present invention is related in general to the field of semiconductor device assembly and packaging, and more specifically to fabricating integrated circuit (IC) devices that are protected against potential damage caused by moisture, contamination, and stress induced defects such as cracks and delamination when incorporated into wafer level chip scale packages.

2. Description of the Related Art

It is well known to use a scribe seal (which may also be referred to as a die seal, an edge seal, or a seal ring) to protect a die against potential damage caused by stress induced defects such as crack formation and delamination formed during processes such as sawing, wirebonding or other assembly processes, soldering, or during rigorous environmental testing. The scribe seal, which is typically formed around a perimeter of the die, is disposed between the die and a saw street (may also be referred to as a scribe street or a dicing street).

It is also well known that stress induced defects such as cracks and delamination are likely to occur near die corners where susceptibility to die failure from such defects is highest. Conventional techniques to reduce damage caused by stress include providing a die layout having a sloped or chamfered corner area rather than a die layout having a sharp corner, e.g., a 90 degree corner, and providing redundant scribe seals for added protection. However, conventional techniques may still be inadequate to protect the die corners, which are formed during the sawing. Due to their porosity, brittleness, and low strength, low-k dielectric layers commonly used in the back end of line (BEOL) stack are particularly susceptible to fracture during the sawing process and blisters or delamination due to mechanical stresses from subsequent packaging, moisture absorption, or thermal cycling. Die failure is most likely to occur at or near the die corners where die stresses are highest and die edge defects can potentially rupture the scribe seal(s).

These issues have been recognized, and various approaches and structures to provide barriers to contamination and moisture and to arrest crack propagation and absorb stresses and damage have been proposed. These earlier approaches, some of which can be quite elaborate, are nevertheless still found to be insufficient to prevent cracks and delamination from occurring, especially in the corners of semiconductor dice that contain low-k dielectric materials and that subsequently undergo processes related to wafer level chip scale packaging (abbreviated WLCSP, WL-CSP, or WCSP). The problems are particularly severe in WLCSP that utilize redistribution layers (RDL) to remap the positions of interconnect solder bumps or balls from the locations of pads on the die, since there are more and thicker package insulating layers required to effect this remapping that are applied directly to the surface of the die, and as a result of having different coefficient of thermal expansion (CTE) from the die, induce significant tensile peel stress to the die edge. Thus there remains a need for improved structures for scribe seals and for methods of fabricating and reinforcing semiconductor devices used in wafer level chip scale packaging.

SUMMARY OF THE INVENTION

These and other problems associated with the prior art are addressed by the present invention, which provides a semiconductor device for use in a wafer level chip scale package (WLCSP), and a method for fabricating a semiconductor device for wafer level chip scale packaging. By providing redundant scribe seals, an inner scribe seal formed around a functional circuit area that does not extend all the way into the corners of the rectangular die, and an outer scribe seal following the perimeter of the die and into the corners, with the outer scribe seal having a continuous barrier wall towards the die edges, moisture penetration in dielectric layers of the die is minimized, and cracks and delamination are stopped near the die edges. Limiting the extent of the insulating layer or layers in the WLCSP to the functional circuit area also reduces the stresses caused by these layers near the die corners. Additional optional features are also provided to further enhance the strength and barrier properties of the scribe seals and the layers near the die corners, to terminate cracks and delamination at various levels within the dielectric stack of the die and the die protective overcoat, and to prevent damage during the WLCSP assembly process.

More specifically, the present invention provides a semiconductor device for wafer level chip scale packaging. The semiconductor device includes a functional circuit area that does not extend all the way into the corners of the die, and a first scribe seal that surrounds the functional circuit area. A second scribe seal is also provided between the first scribe seal and the outer edge of the die formed by a saw or scribe operation, and extends into the corners of the die. The second scribe seal has at least two barrier walls, one of which is a continuous barrier wall adjacent to the outer edge of the die, and another barrier wall constructed of discontinuous metal vias interconnecting electrically conductive layers. The semiconductor device also has package insulating layer formed on the top surface of the die and substantially covering the functional circuit area. The package insulating layer may for example be made of polyimide (PI), benzocyclobutene (BCB), or polybenzoxazole (PBO).

The present invention also provides a method for fabricating a semiconductor device for wafer level chip scale packaging. A die having a rectangular outer edge is surrounded with a first scribe seal around a perimeter of a functional circuit area. A second scribe seal is placed between the first scribe seal and the outer edge of the die, and extends along the outer edge of the die into the corners. The second scribe seal has at least two barrier walls, one of which is a continuous barrier wall adjacent to the outer edge of the die, and another barrier wall constructed of discontinuous metal vias interconnecting electrically conductive layers. A package insulating layer is formed on the top surface of the die substantially covering the functional circuit area, but not extending fully into the corners of the die.

Several advantages are achieved by the device and method according to the illustrative embodiments presented herein. The embodiments advantageously provide an improved scribe seal structure that extends scribe seal protection close to the physical die corners, where the induced stress is the highest. This limits the length of the cracks, and hence limits the leverage action of the stress forces before they encounter a metal wall. Reducing the extent of the insulating layer or layers used in the WLCSP to the extent of the functional circuit area also reduces the stresses caused by these layers near the die corners. The semiconductor device having the improved scribe seal structure is advantageously manufacturable by using existing materials and processes, thereby improving reliability and avoiding additional costs.

Other features and advantages of the present invention will be apparent to those of ordinary skill in the art upon reference to the following detailed description taken in conjunction with the accompanying drawings, and the appended claims.

BRIEF DESCRIPTION OF THE VIEWS OF THE DRAWINGS

For a more complete understanding of the present invention, and the advantages thereof, reference is now made to the following description taken in conjunction with the accompanying drawings, in which.

DETAILED DESCRIPTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Figure 1:
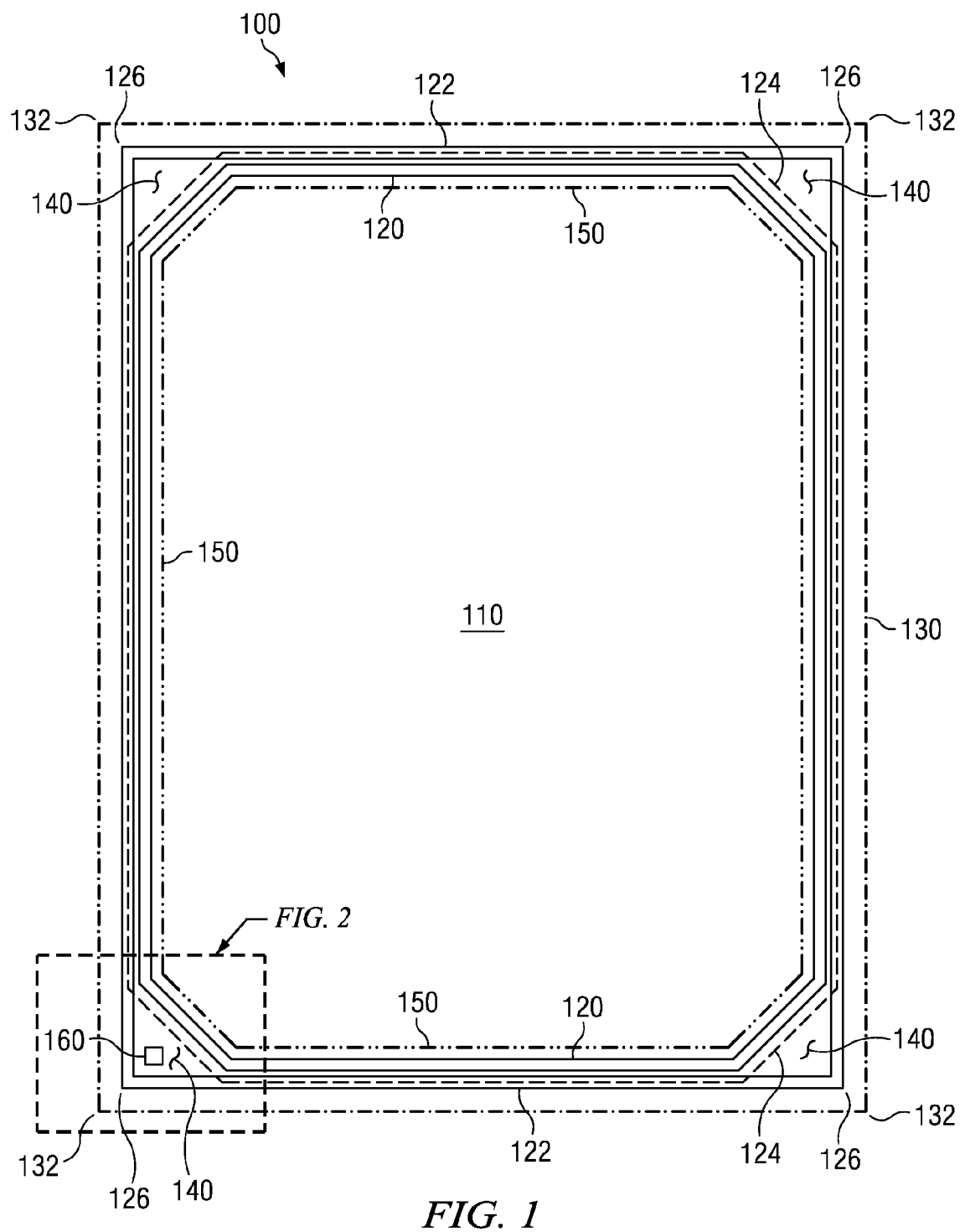
FIG. 1 illustrates a simplified and schematic top view of a semiconductor device for wafer level chip scale packaging according to an embodiment of the present invention.

Referring now to FIG. 1, a simplified and schematic top view of a semiconductor device 100 according to the present invention is shown. The semiconductor device 100 includes a die 110, typically having a rectangular shape with four physical edges 130 created by a singulation process (sawing or scribing, typically sawing with a high-speed diamond wheel) and four physical corners 132. Functional circuit structures including active semiconductor devices and interconnects are confined to an area defined by perimeter 150. This perimeter may be diagonally removed (typically running at 45 degrees) from proximity to the sharp corners 132 in order to remove functional circuit structures from the highest-stress regions of the die near the corners. Thus the exemplary functional circuit area is octagonal in shape. The spaces 140 outside the functional circuit area 150 may be used for noncritical functions such as test structures to be used while the devices are still unsingulated in wafer form, alignment structures, etc. This space is also available for structures to improve the mechanical and electrical reliability of the semiconductor device 100. Test or other structures that are not functional circuit structures that reside in the lower left corner area 140 in the figure are indicated schematically by the square labeled by reference numeral 160. A number of various and different structures can fit simultaneously into this area, as will soon be described.

A scribe seal is a metal structure, which consists of a plurality of metal layers connected by vias. The scribe seal forms a wall of metal to protect the die against potential damage. The scribe seal thus provides a physical buffer area that allows for the dissipation of energy or stress induced during processes such as sawing, wirebonding, soldering, or during rigorous environmental testing. The scribe seal also provides a protective barrier for the die against infiltration by contaminants such as moisture and chemical impurities, which may be generated during processes such as sawing and soldering. A scribe seal is fabricated in the same manner as the back end of line (BEOL) stack of a semiconductor device. Typical semiconductor devices are provided with at least one scribe seal surrounding the functional circuit area 150. Also shown in FIG. 1 is a scribe seal 120 that follows the perimeter of the functional circuit area 150. Scribe seal 120 is shown as a double line to indicate a pair of parallel perimeter structures in accordance with an exemplary embodiment described herein. This scribe seal may also be referred to herein as an inner scribe seal.

A second scribe seal 122 is also shown in FIG. 1 disposed between scribe seal 120 and the rectangular physical die perimeter 130. This scribe seal is also shown as a double line to indicate a pair of structures as will be described in detail later. Scribe seal 122 may also be referred to herein as an outer scribe seal. It can be seen that second scribe seal 122 does not follow the diagonal corners of functional circuit area 150 and scribe seal 120, but rather extends to have rectangular corners 126 near the physical die corners 132. The details of these scribe seal corners can not be seen in this low-magnification view, but they may or may not form sharp 90 degree outside corners. It is advantageous to locate second scribe seal corners 126 within a configurable distance of physical die corners 130. The configurable distance may depend of various factors such as saw street width, saw kerf, and similar others. The configurable distance, which may be made as small as practical, advantageously limits the dimensions of defects such as the cracks, blisters or delamination. By limiting the distance between the physical die corners 130 and the second scribe seal 150, the leverage action of the stress forces is also limited. Thus, the seal structure is able to better absorb the energy associated with crack propagation.

In wafer-level chip scale packaging, after BEOL fabrication of finished wafers, further processing is performed while the semiconductor devices remain in wafer form to create encapsulation or additional passivation as well as create the lower-density interconnects to external circuit boards. This involves applying additional package insulating layers, conducting layers to form package pads, and the formation or placement of solder balls or bumps on the package pads. In a bump over repassivation (BOR) implementation, solder balls are formed directly over pads as they are defined on the semiconductor device in the BEOL process. This requires a single package insulating layer. In a redistribution layer (RDL) implementation, the solder balls or bumps may be placed independently of the position of the device pads from the BEOL process. This is accomplished using a conductive redistribution layer (RDL) on top of a first package insulating layer, and then applying a second package insulating layer with openings over pads in the RDL where repositioned solder balls or bumps are to be formed or affixed. Lithography and etching steps are required in this packaging process.

Package insulating layer materials are typically polymers such as polyimide (PI), benzocyclobutene (BCB), or polybenzoxazole (PBO), which may have planarizing properties and may be photoimageable. Such polymers may be several micrometers thick, and as a result of having different coefficient of thermal expansion (CTE) from the die, induce significant tensile peel stress to the die edge. In an embodiment, the extent of the package insulating layers is limited to be not much greater than the functional circuit area 150. This is indicated in FIG. 1 by dashed line 124 generally indicating an outer perimeter of a package insulating layer or layers. The outer edge 124 of the package insulating layer extends outside the first scribe seal 120, and is shown to extend only part of the way across second scribe seal 122 toward the outer edge 130 of die 110. Besides additional reasons to be described later, it is generally preferable not to saw a polymer package insulating material using a dicing saw.

Figure 2:
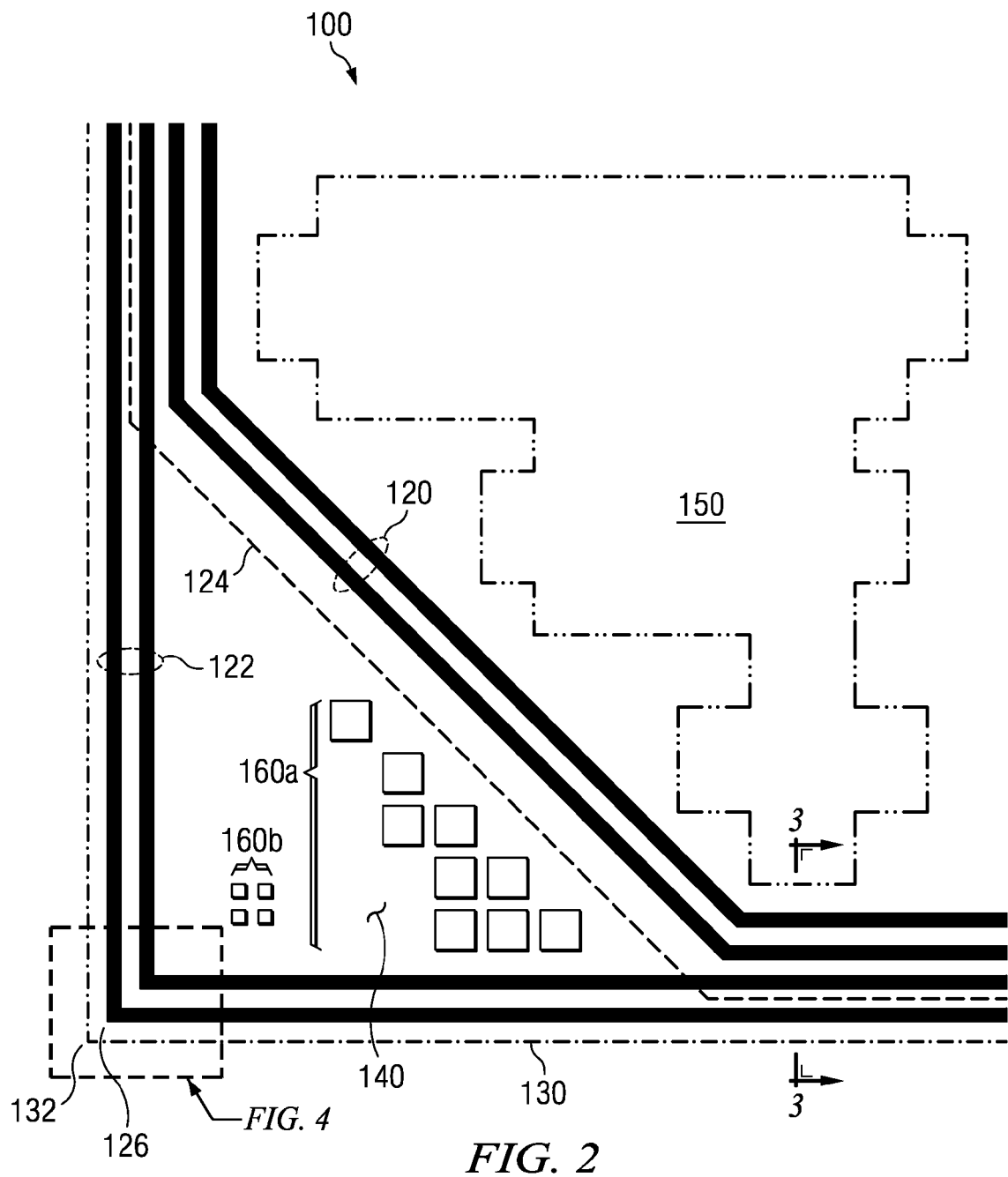
FIG. 2 illustrates a simplified and schematic top view of a semiconductor device according to an embodiment of the present invention, showing an enlarged detail of the corner region circled in FIG. 1.

The lower left corner of FIG. 1 is circled to indicate an area of semiconductor device 100 that has been enlarged for further discussion in FIG. 2. Referring now to FIG. 2, a simplified and schematic top view of semiconductor device 100 in accordance with the present invention is shown. Functional circuits, or the layout data therefore, are again indicated by reference numeral 150. With this greater enlargement, it can now be seen that, in this exemplary embodiment, scribe seals 120 and 122 consist of parallel structures appearing as double wide lines. In fact, these wide lines indicate the appearance of an upper layer of what may be a more intricate structure that is described later. Section line 3-3 shows the direction of a cross sectional view along edge 130 that will be discussed in detail with reference to FIG. 3. Reference numeral 126 indicates the outer corner of scribe seal 122, which can be placed close to physical die corner 132. It is desirable to place corner 126 as close to corner 132 as possible, which limits the length of nascent cracks, and hence limits the leverage action of the stress forces before they encounter a feature in scribe seal 122 that can stop their propagation. However, this distance should be maintained greater than the width of damage zone caused by the dicing saw, so that scribe seal 122 itself is not compromised by the sawing operation.

Continuing to refer to FIG. 2, at this enlargement, more details can be seen of the scribe structures 120 and 122 and the corner area 140 between them due to the greater enlargement from that of FIG. 1. Multiple structures that may be test or calibration structures of various types will fit in this area, and are indicated by a number of squares labeled 160a. In addition, structures may be included that have a mechanical function such as to help to fasten down layers in the corner. Such a structure 160b is indicated schematically by a two-by-two array of small squares similar to a structure to be described later in FIG. 4.

Figure 3:
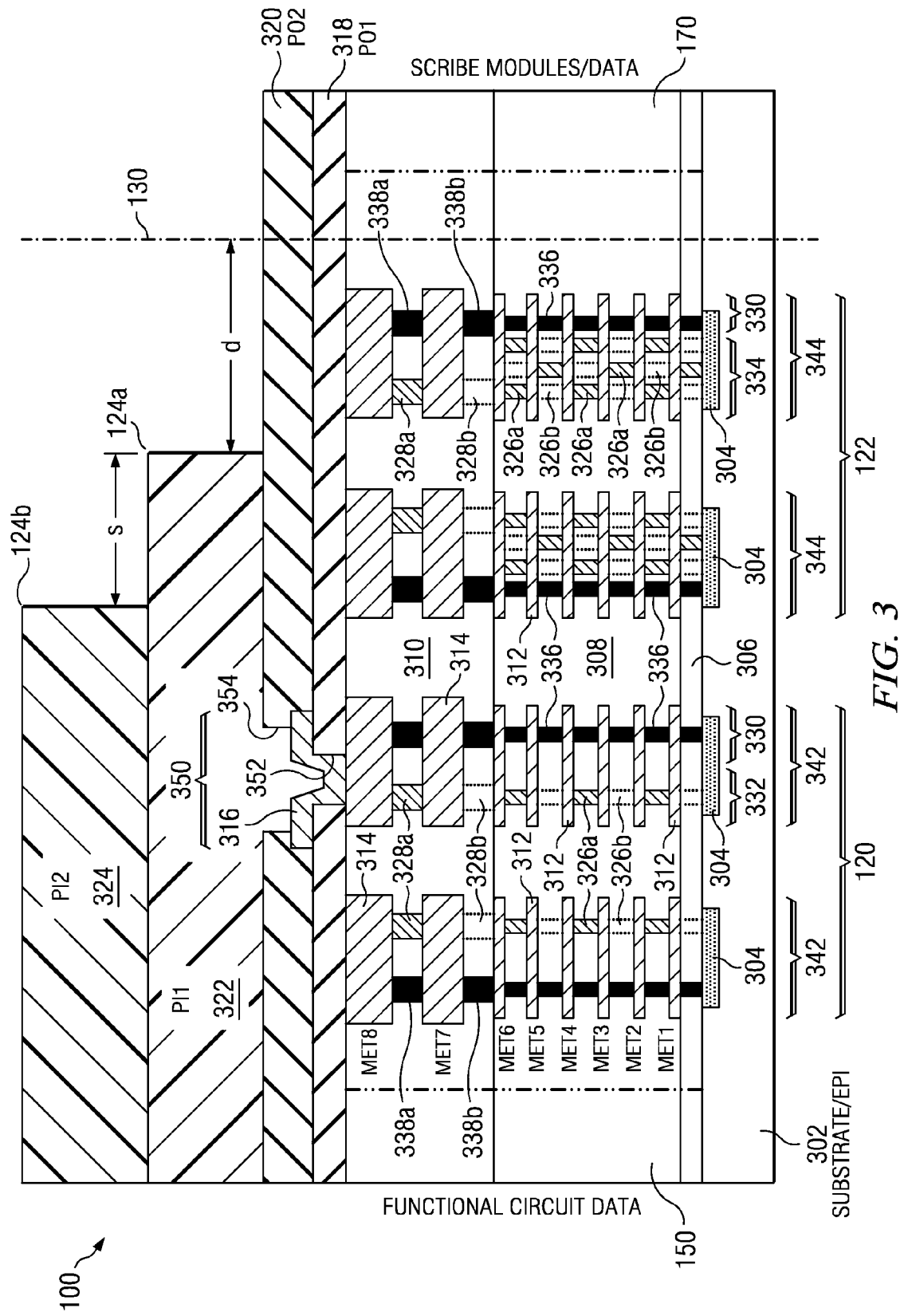
FIG. 3 illustrates a simplified and schematic cross sectional view of a semiconductor device, described with reference to FIG. 2, according to an embodiment of the present invention.

Referring now to FIG. 3, an enlarged cross section from FIG. 2 is shown of a portion of semiconductor device 100 near a physical die edge 130. The direction of the view is shown by section line labeled 3-3 in FIG. 2. Scribe seal structures 120 and 122 are formed in integrated circuit device layers upon a semiconductor substrate 302, perhaps having an epitaxial layer on its top surface. Highly-doped active or moat regions 304 are shown underlying the scribe seal structures, so that electrical contact can be made to preferably ground the scribe seal structures or connect them to VSS, as is known in the art. A device having eight metal layers 312 and 314 is shown. The cross-sectional appearance is of that of a planarized metal process such as is used with copper metallization layers, with the last two metal layers 314 thicker than the lower layers 312. A pre-metal dielectric (PMD) layer is shown by reference numeral 306, while in this example, five low-k intermediate level dielectrics are indicated by numeral 308, and two final dielectric layers, which may or may not be of low-k material, are shown by numeral 310. It can be seen that first or inner scribe seal 120 and second or outer scribe seal 122 include a number of fine structures that could not be seen in the top views at lower magnification of the previous figures. Each scribe seal consists of a pair of composite structures, preferably in a mirrored arrangement as shown. For example, the outer scribe seal 122 consists of two sets 344 of stacked vias and trenches connecting metal layers within the device. Each set 344 consists of one continuous stack 330 of trenches 336, 338a, and 338b, forming a continuous barrier wall of metal extending out of the plane of the page and along the length of the scribe seal, as indicated by a solid shading of the trenches, plus a discontinuous stack 334 consisting of vias 326a, 326b, 328a, and 328b, indicated by cross-hatched shading, rather than trenches that are thus discontinuous in each dielectric (via) layer along the length of the scribe seal. The arrangement is "mirrored" in that the sets 342 and 344 are in pairs facing opposite directions, so that the trench or continuous barrier wall sides face outwards from the center line of the pair of sets comprising scribe seals 120 and 122.

Figure 4:
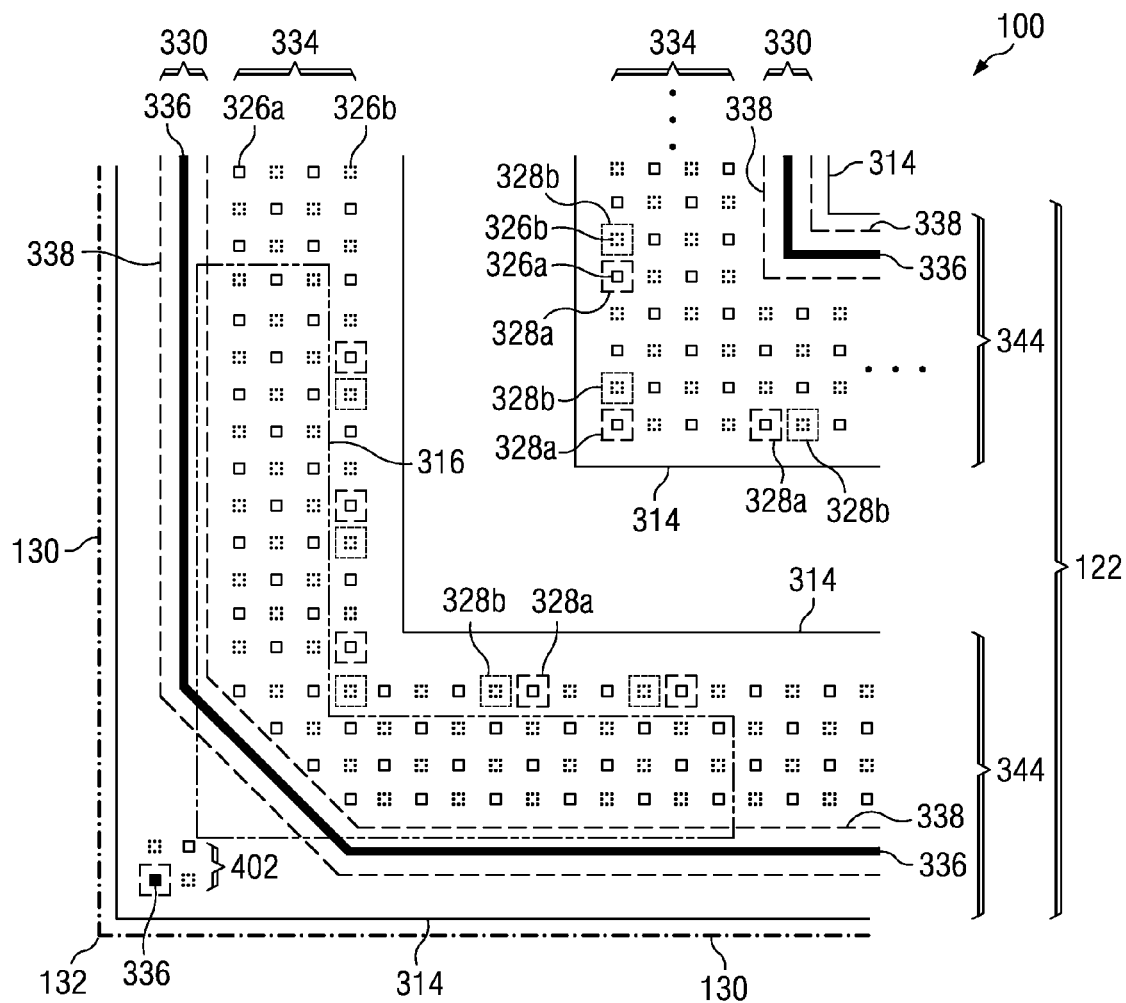
FIG. 4 illustrates a simplified mask layout view of a semiconductor device according to an embodiment of the present invention, showing an enlarged detail of the corner region circled in FIG. 2.

In the inner scribe seal 120, a single stack 332 of vias may be used. In the outer scribe seal 122, it is advantageous to incorporate a larger number of vias in each dielectric layer. In the embodiment shown, three vias 326a or 326b and one trench 336 are shown in each layer within the low-k dielectric layers 308. More are possible, as is shown in FIG. 4, and this design may also be applied to the inner scribe seal 120 for increased protection from cracks and delamination. Instead of stacking all vias one above the other, which in thick interconnect layer stacks can result in high stresses throughout the stack, vias in subsequent layers can be staggered with respect to each other, for example, so that a regular array of vias is occupied alternately as described in U.S. Pat. No. 6,521,975, issued Feb. 18, 2003, by West et al.

Still referring to FIG. 3, additional crack suppression in the protective overcoat layers 318 (PO1) and 320 (PO2) can be obtained by creating a protective overcoat removal (POR) feature 350 including an opening 352 in PO1 and an opening 354 in PO2. In a copper metallization process, if the top layer is copper, than it is preferably protected by a metal cap layer 316 deposited as shown to cover the exposed MET8. This metal cap layer can be aluminum or a stack of metals containing aluminum and perhaps additional barrier or adhesion layers. A first package insulating layer 322 (PI1) is formed on top of layer 320 for wafer level chip scale packaging. The edge 124a of this layer must be set back a distance d from the die edge 130 as dictated by process and alignment design rules for the packaging process. This may place the edge 124a as shown over the outer scribe seal 122. If this is the case, then it may be preferable not to have a POR feature 350 associated with outer scribe seal 122, because of design rules dictating proximity of PI1 to underlying topography features. With the exemplary dimensions illustrated in FIG. 3, this is the case and no opening in the PO1 and PO2 is shown over outer scribe seal 122.

If a second package insulating layer 324 is used (PI2), such as in redistribution layer (RDL) type WLCSP, then it is a feature of the present invention to place its outer edge 124b not outside (toward die edge 130) or directly over edge 124a of layer 322 (PI1), but instead to set it away from the die edge closer to the center of the die than edge 124a by a distance s. This reduces the peel stress associated with the edge of the package insulating layers, and thus improves the reliability with respect to delamination caused by this peel stress.

Test structures known as scribe modules 170 can also be placed in the scribe lane or saw street between the illustrated semiconductor device 100 and a neighboring device on the wafer. These test structures can be used in wafer-level testing, and are destroyed during the sawing or dicing operation that singulates the semiconductor devices, before packaging for some package types, or after wafer-level chip scale packaging processes are performed in the case of WL-CSP.

Now referring to FIG. 4, a mask layout or top view of semiconductor device 100 is shown corresponding to the cross-section just described, and in particular of an enlarged portion of the corner region indicated by the circle in the lower left corner of FIG. 2, showing just the two mirrored parallel structures of outer scribe seal 122. In this layout, details falling "within" (underneath) metal lines 314 are clearly seen, including small alternately positioned vias 326a and 326b in the lower via layers, larger alternately positioned vias 328a and 328b in the top two via layers. Those alternating via structures form mechanical discontinuous barrier walls 334. In this example, four rows of small vias 326a and 326b are used across the width of each set, rather than three as shown in FIG. 3. The continuous barrier walls 330 formed by trenches 336 in the lower via layers and wider trenches 338 in the top two via layers can also be seen on the outer edge of the lower structure and the inner edge of the structure at the upper right. Since there is no package insulating layer over this corner area, a bracket-shaped feature of cap metal 316 (shown in dash-double dot line type) can be seen overlying the outer set 344 to add protection and strength.

Other features to reduce corner stress are also provided in this embodiment and shown in the lower left corner of FIG. 4. The continuous barrier wall 330 at the lower left corner, nearest die corner 132, is chamfered so that there are no 90 degree bends that can cause etch problems and concentrate stress. This chamfer then leaves room for an additional set 402 of an exemplary 2×2 array of alternating and stacked vias in the corner to further tie down the dielectric layers near the die corner. This feature 402 is much smaller than the feature 160b shown in FIG. 2, which is not between the corner of outer scribe seal 122 and the die corner 132, but instead fits within the larger corner area 140 shown in FIG. 2. Reinforcement feature 160b may be used in addition to reinforcement feature 402.

Figure 5:
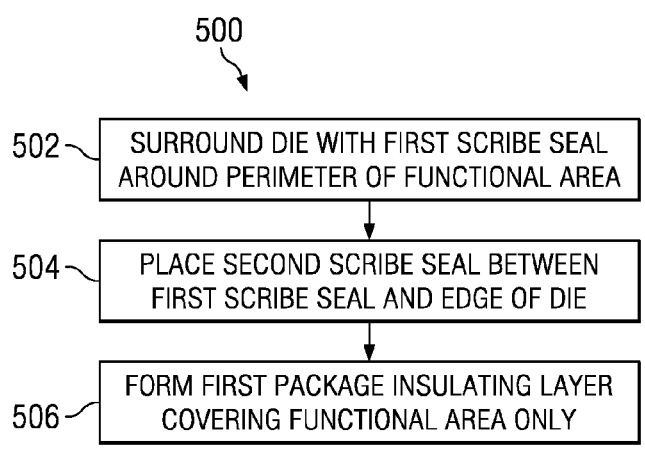
FIG. 5 is a flow chart illustrating a method for fabricating a semiconductor device for wafer level chip scale packaging according to an embodiment of the present invention.

Now refer to FIG. 5, which illustrates a flow chart of an exemplary method 500 for fabricating a semiconductor device for wafer level chip-scale packaging that exhibits the benefits and advantages of the present invention. In step 502, a die is surrounded with a first or inner scribe seal around the perimeter of the functional area. This scribe seal can be a conventional scribe seal, or it can include additional advantageous features described and depicted in detail earlier with reference to the outer or second scribe seal. It preferably does not extend into the corners of the die, but rather has a chamfer or slope near the corners that follows the perimeter of the functional area closely. Next, a second scribe seal is positioned between the first scribe seal and the edge of the die in step 504. This scribe seal may have enhanced crack suppression features as described previously, and preferably is formed so that it has an outer barrier wall adjacent the die edge that is a continuous barrier wall. This continuous barrier wall suppresses cracks, but particularly is effective at stopping migration of moisture into the semiconductor device through the edge of the dielectric layers, which is especially important when porous and brittle low-k dielectric layers are exposed by the dicing or singulation operation. Finally, in step 506, a first package insulating layer is formed covering only the functional area and avoiding the corner regions of the die. A single package insulating layer may suffice for a WLCSP of the bump-over-repassivation (BOR) type. Further optional processing may be performed to complete packaging the device, which may include metallization, possible application of more insulating package layers, and forming or affixing solder bumps, balls, or other contact structures. For example, for a WLCSP of the redistribution layer (RDL) type, a second package insulating layer may be formed on top of the first package insulating layer. In this case, it is advantageous to configure the edge of the second package insulating layer to lie farther away from the edges and corners of the die in order to reduce the total peel stress at the outer edge of the first package redistribution layer.

A number of advantages provided by the present invention will be readily apparent to those skilled in the art. The novel scribe seal design and device construction of the present invention reduce susceptibility to corner delamination in devices employing low-k dielectrics by improving crack suppression of saw-induced damage near die edges and corners. Since the present invention is defined in design and layout, it is a new structure, but does not require any new fabrication processes. The inventive structures are formed during the normal processing of modern integrated circuit semiconductor devices, and do not require additional process steps to be performed, so that additional costs are avoided while achieving the numerous benefits and advantages.

The present invention has been described in connection with applications within a WLCSP. It will be appreciated that such a package is representative of only one suitable environment for use of the invention, and that the invention may be used in a multiple of other environments in the alternative. For example, the reliability of flip-chip or other packages, especially those that employ low-k dielectrics, may be improved using semiconductor devices designed and fabricated according to the present invention and the methods of fabrication taught herein. The invention should therefore not be limited to the particular implementations heretofore discussed.

Although preferred embodiments provided by the present invention have been described in detail, and several alternative forms of the invention have been shown, it will be apparent to those skilled in the art that the principles taught herein may be implemented in many other ways and by using circuits and methods differing in a number of details. It will therefore be understood by those skilled in the art that various modifications can be made therein without departing from the spirit and scope of the invention as set forth in the appended claims.

We claim:

1. A semiconductor device for wafer level chip scale packaging comprising:
    a die having a top surface, and an outer edge in the shape of a rectangle, the die having a functional circuit area that does not extend into the corners of the die;
    a first scribe seal formed around a perimeter of the functional circuit area, wherein the first scribe seal comprises a set of at least two barrier walls, the set comprising at least one continuous barrier wall, and the set further comprising at least one discontinuous barrier wall comprising an array of metal vias interconnecting electrically conductive layers;
    a second scribe seal formed between the first scribe seal and the outer edge of the die and following the outer edge into the corners of the die, the second scribe seal comprising a set of at least two barrier walls, the set comprising at least one continuous barrier wall adjacent the outer edge of the die, and the set further comprising at least one discontinuous barrier wall comprising an array of metal vias interconnecting electrically conductive layers; and a first package insulating layer formed on the top surface of the die and having an outer edge, the first package insulating layer substantially covering the functional circuit area.

2. The semiconductor device of claim 1, wherein the second scribe seal is in electrical contact with a heavily doped region of the substrate to ground the second scribe seal.

3. The semiconductor device of claim 1, wherein the second scribe seal has more vias in its at least one discontinuous barrier wall across a width dimension of the second scribe seal than the first scribe seal has in its discontinuous barrier wall across a width dimension of the first scribe seal.

4. The semiconductor device of claim 1, wherein the first package insulating layer is selected from the group consisting of polyimide (PI), benzocyclobutene (BCB), and polybenzoxazole (PBO).

5. The semiconductor device of claim 1, wherein at least one of the first scribe seal and the second scribe seal comprise at least two sets of barrier walls, each set comprising at least one continuous barrier wall, and each set further comprising at least one discontinuous barrier wall comprising an array of metal vias interconnecting electrically conductive layers, the at least two sets of barrier walls disposed in a mirrored arrangement wherein the barrier wall of the set closest the outer edge of the die is a continuous barrier wall.

6. The semiconductor device of claim 1, wherein each outside corner of the second scribe seal is chamfered to eliminate a 90 degree corner in the continuous barrier wall.

7. The semiconductor device of claim 6, wherein one or more stacks of metal vias interconnecting electrically conductive layers are disposed between the second scribe seal and each die corner.

8. The semiconductor device of claim 1, further comprising a protective overcoat formed on the top surface of the die underneath the first package insulating layer, and a trench opened into the protective overcoat along a length of the first scribe seal.

9. The semiconductor device of claim 8, wherein the trench is at least partially filled with metal.

10. A semiconductor device for wafer level chip scale packaging comprising:
a die having a top surface, and an outer edge in the shape of a rectangle, the die having a functional circuit area that does not extend into the corners of the die;
a first scribe seal formed around a perimeter of the functional circuit area
a second scribe seal formed between the first scribe seal and the outer edge of the die and following the outer edge into the corners of the die, the second scribe seal comprising a set of at least two barrier walls, the set comprising at least one continuous barrier wall adjacent the outer edge of the die, and the set further comprising at least one discontinuous barrier wall comprising an array of metal vias interconnecting electrically conductive layers;
a first package insulating layer formed on the top surface of the die and having an outer edge, the first package insulating layer substantially covering the functional circuit area; and
a second package insulating layer having a thickness and formed on top of the first package insulating layer, wherein each edge of the second package insulating layer is withdrawn from the outer edge of the first package insulating layer, such that the second package insulating is smaller in lateral extent than the first package insulating layer.

11. The semiconductor device of claim 10, wherein the outer edge of the second package insulating layer is withdrawn from the outer edge of the first package insulating layer by a distance approximately equal to the thickness of the second package insulating layer.

12. A method for fabricating a semiconductor device for wafer level chip scale packaging, the method comprising the steps of:
surrounding a die having a rectangular outer edge with a first scribe seal around a perimeter of a functional area that does not extend into the corners of the die;
placing a second scribe seal between the first scribe seal and the outer edge of the die and following the outer edge into the corners of the die, the second scribe seal comprising a set of at least two barrier walls, the set comprising at least one continuous barrier wall adjacent the outer edge of the die, and the set further comprising at least one discontinuous barrier wall comprising an array of metal vias interconnecting electrically conductive layers;
disposing structures comprising an array of one or more metal vias interconnecting electrically conductive layers between the first scribe seal and each corner of the die, whereby the structures provide additional strength in the corners of the die; and
forming a first package insulating layer having an outer edge on the top surface of the die, the first package insulating layer substantially covering the functional circuit area.

13. The method of claim 12, wherein the second scribe seal is placed adjacent but not touching a dicing damage zone extending inward from the outer edge of the die.

14. The method of claim 12, wherein the structures are disposed between the second scribe seal and the corners of the die.

15. The method of claim 12, further comprising the step of forming a second package insulating layer having an outer edge on top of the first package insulating layer, wherein the outer edge of the second package insulating layer is placed a configurable distance from the outer edge of the die that is greater than the distance of the outer edge of the first package insulating layer from the outer edge of the die.

16. The method of claim 15, wherein the configurable distance is approximately equal to the thickness of the second package insulating layer.

17. The method of claim 12, wherein the die has a protective overcoat formed on its top surface and underneath the first package insulating layer, and further comprising the step of opening a trench into the protective overcoat along a length of the first scribe seal.

18. The method of claim 17, further comprising the step of filling the trench at least partially with metal.

19. The method of claim 12, wherein surrounding the die with the first scribe seal comprises forming a set of at least two barrier walls, the set comprising at least one continuous barrier wall, and the set further comprising at least one discontinuous barrier wall comprising an array of metal vias interconnecting electrically conductive layers.

20. The method of claim 19, wherein at least one of surrounding the die with the first scribe seal and placing the second scribe seal comprises forming at least two sets of barrier walls, each set comprising at least one continuous barrier wall, and each set further comprising at least one discontinuous barrier wall comprising an array of metal vias interconnecting electrically conductive layers, the at least two sets of barrier walls disposed in a mirrored arrangement wherein the barrier wall of the set closest the outer edge of the die is a continuous barrier wall.

* * * * *